United States Patent
Kelemen et al.

(10) Patent No.: US 9,450,375 B2
(45) Date of Patent: Sep. 20, 2016

(54) HIGH-POWER DIODE LASER AND METHOD FOR PRODUCING A HIGH-POWER DIODE LASER

(75) Inventors: Márc Kelemen, Gundelfingen (DE); Rudolf Moritz, Denzlingen (DE); Jürgen Gilly, Gundelfingen (DE); Patrick Friedmann, Simonswald (DE)

(73) Assignee: M2K-Laser GmbH, Freiburg (DE)

( * ) Notice: Subject to any disclaimer, the term of this patent is extended or adjusted under 35 U.S.C. 154(b) by 112 days.

(21) Appl. No.: 12/870,946

(22) Filed: Aug. 30, 2010

(65) Prior Publication Data

US 2011/0051767 A1    Mar. 3, 2011

(30) Foreign Application Priority Data

Aug. 28, 2009 (DE) .................. 10 2009 028 985
Dec. 17, 2009 (DE) .................. 10 2009 054 912

(51) Int. Cl.
*H01S 5/00* (2006.01)
*H01S 5/028* (2006.01)
*H01S 5/02* (2006.01)

(52) U.S. Cl.
CPC ............ *H01S 5/0021* (2013.01); *H01S 5/028* (2013.01); *H01S 5/0202* (2013.01); *H01S 5/0282* (2013.01); *H01S 5/0283* (2013.01)

(58) Field of Classification Search
CPC .... H01S 5/0021; H01S 5/028; H01S 5/0202; H01S 5/0282; H01S 5/0283
USPC ..................................... 372/49.01
See application file for complete search history.

(56) References Cited

U.S. PATENT DOCUMENTS

| | | | |
|---|---|---|---|
| 4,337,443 A * | 6/1982 | Umeda et al. | 372/49.01 |
| 4,563,368 A | 1/1986 | Tihanyi et al. | |
| 5,063,173 A | 11/1991 | Gasser et al. | |
| 5,144,634 A | 9/1992 | Gasser et al. | |
| 5,171,717 A | 12/1992 | Broom et al. | |
| 5,780,120 A | 7/1998 | Belouet et al. | |
| 5,939,732 A | 8/1999 | Kurtz et al. | |
| 6,396,864 B1 | 5/2002 | O'Brien et al. | |
| 6,618,409 B1 * | 9/2003 | Hu et al. | 372/43.01 |
| 6,798,805 B2 | 9/2004 | Yamanaka | |
| 7,338,821 B2 | 3/2008 | Ressel et al. | |
| 2010/0129994 A1 | 5/2010 | Awad et al. | |

FOREIGN PATENT DOCUMENTS

| | | |
|---|---|---|
| DE | 102 21 952 A1 | 11/2003 |
| EP | 0637862 A2 | 2/1995 |
| JP | S5955077 A | 3/1984 |
| JP | 4-32285 A | 2/1992 |
| WO | 2008/104059 A1 | 9/2008 |

* cited by examiner

*Primary Examiner* — Xinning Niu
(74) *Attorney, Agent, or Firm* — Laurence A. Greenberg; Werner H. Stemer; Ralph E. Locher

(57) ABSTRACT

In a high-power diode laser, facets which lie opposite one another contain in each case an amorphous layer system composed of silicon and carbon. The layer system is formed to perform the function both of a passivation layer and of the reflection-determining functional layers. This measure makes it possible to produce a high-power diode laser having a high COD threshold in conjunction with a long service life by way of a simplified method.

7 Claims, 3 Drawing Sheets

HIGH-POWER DIODE LASER AND METHOD FOR PRODUCING A HIGH-POWER DIODE LASER

CROSS-REFERENCE TO RELATED APPLICATION

This application claims the priority, under 35 U.S.C. §119, of German patent applications Nos. DE 10 2009 028 985.2, filed Aug. 28, 2009, and DE 10 2009 054 912.9, filed Dec. 17, 2009; the prior applications are herewith incorporated by reference in their entirety.

BACKGROUND OF THE INVENTION

Field of the Invention

The invention relates to a high-power diode laser and a method for producing a high-power diode laser.

High-power diode lasers, that is to say diode lasers having high power densities based on III-V semiconductor layers such as (Al,In)GaAs, (Al,In)InP and (Al,In)GaSb, find diverse applications in a wide variety of fields. These include, for instance, the pumping of solid-state, fiber and disk lasers, direct material processing by way of diode laser modules, and medical therapy and diagnostics.

Diode lasers with an optical power density of more than 40 mW per micrometer facet width are defined hereinafter as high-power diode lasers. The two opposite light exit surfaces of a diode laser are designated hereinafter as facets.

In the context of the present-day high quality of the III-V semiconductor layers, both the lifetime and the maximum possible optical output power of high-power diode lasers are limited primarily by the quality of their facets. The starting product in the production of high-power diode lasers is wafers containing a multiplicity of laser diodes. For the purpose of singulating, or dicing, the laser diodes or laser diode arrays or diode laser bars, the wafers are broken, layer systems that form the facets of the high-power diode laser being applied in each case to breaking locations or cleavage faces. Particularly when wafers are broken in air, a mixture of different semiconductor oxides arises at the cleavage face. This oxide layer, owing to the high density of interface states, is the cause of a high proportion of non-radiative recombination, with the result that local heating takes place in the region of the facet during the operation of the high-power diode laser. This heating is associated with a reduction of the band gap. This in turn leads to further heating in the region of the facet and thus to increasing reduction of the band gap in a very short time, with the result that the high-power diode laser in the region of the facet and hence also the facet itself are heated to a greater and greater extent. The facet is thereby substantially thermally destroyed within a very short time. This process limits the maximum possible optical output power of high-power diode lasers.

In addition, the oxides are chemically unstable with respect to the semiconductor materials. Accordingly, the lattice defects causing the heating of the facet propagate inside the semiconductor. The effects mentioned lead to two significant restrictions for the lifetime of the semiconductor components. Firstly, a continuous degradation is obtained, which is characterized by a continuous increase in the operating current required for a constant output power. Secondly, on account of the degradation of the semiconductor material, there is a decrease in the threshold for the operating current above which a sudden destruction of the mirror surfaces and hence a spontaneous failure of the high-power diode laser (called COD, catastrophic optical damage) occurs, with the result that the optical output power of the high-power diode laser that is maximally possible in the case of operation below the COD threshold decreases in the course of the operating period.

In order to reduce the extent of the degradation of the semiconductor material and the reduction of the COD threshold caused thereby, it is known in the production of high-power diode lasers to produce cleavage faces which contain no oxygen and are free of substances which can react with the semiconductor materials in the region of the cleavage faces. This is done either by breaking the wafer in an oxygen-free atmosphere, or by subjecting the cleavage face to a treatment after breaking in air, during which treatment said cleavage face is cleaned, that is to say that the oxygen contained in the cleavage face is removed or bonded, with the result that it is less reactive chemically.

Afterward, care has to be taken to ensure that the cleavage face which is free of oxygen or contains oxygen only in a bonded (oxidic) form is furthermore kept free of oxygen that reacts in an uncontrolled manner. For this purpose, the cleaned cleavage face has to be encapsulated by a protective layer, designated as passivation layer hereinafter. Afterward, the desired reflectivity of the high-power diode laser is set by applying further optical, reflectivity-determining functional layers.

Avoiding contact with air is described as an effective method for producing oxide-free cleavage faces in U.S. Pat. Nos. 5,063,173; 5,144,634; and 5,171,717. This is done by singulating a wafer into diode laser arrays in ultra high vacuum at a pressure that is less $10^{-8}$ mbar. Afterward, a thin passivation layer of approximately 20 nm optionally consisting of the materials of Si, Ge or Sb is applied in situ by electron beam vapor deposition.

U.S. Pat. No. 4,563,368 describes a passivation layer for high-power diode layers cleaved in air, consisting of reactive material such as Al, Si, Ta, V Sb, Mn, Cr or Ti, applied by ion beam sputtering under argon at $8 \times 10^{-5}$ mbar. In this case, Si can be applied either in a hydrogen environment or as a silane compound. Afterward, in the same sample chamber, one or a plurality of layers can be sputtered for the purpose of setting the reflectivity, consisting of the materials Si, $SiO_2$ and $Al_2O_3$.

U.S. Pat. No. 6,618,409 B1 describes a passivation concept for laser diode arrays broken in air, this concept being based on a multistep process in a vacuum installation with a total of three separate process chambers. It is characterized in that the facets are cleaned under ultra high vacuum of $3 \times 10^{-10}$ to $1 \times 10^{-7}$ mbar using either an $H_2/Ar$ or $H_2//Xe$ ion gun or a hydrogen ECR (electron cyclotron resonance) plasma comprising pure $H_2$ or $Ar/H_2$ or $Xe/H_2$ mixtures as gas source with a kinetic energy of between 1 eV and 24 eV. The process temperature during the removal (reduction) of the oxide layer is less than 200° C. Afterward, hydrogenated amorphous silicon (a-Si:H) is applied by sputtering as a passivation layer having a thickness of approximately 20 nm, likewise at a process temperature of less than 200° C. After the passivation has ended, one or a plurality of functional layers for setting the reflectivity are applied by means of ion beam sputtering in two further process chambers, $SiO_2$ and $Nb_2O_5$ being used as material for the highly reflective layers and $Nb_2O_5$ being used as material for the layers of low reflectivity.

U.S. Pat. No. 7,338,821 B2 and its counterpart German published patent application DE 102 21 952 A1 describe a passivation concept for laser diode arrays broken in air, which concept is based on a multi-step process in two separate vacuum installations. The laser diode arrays are heated to a temperature of between 350° C. and 420° C. and are cleaned under ultra high vacuum of $1\times10^{-8}$ to $1\times10^{-7}$ mbar using atomic or excited molecular hydrogen as reactive medium with a kinetic energy of less than 2 eV. Afterward, a protective layer composed of one of the materials ZnSe, $Gd_2O_3$, Si or BeTe is applied by vapor deposition as a passivation. After the passivation has ended, one or a plurality of functional layers for setting the reflectivity, composed of one or more of the materials $Al_2O_3$, $TiO_2$, $SiO_2$, $Ta_2O_5$ or Si, are applied by means of ion beam sputtering in a second vacuum apparatus.

U.S. Pat. No. 4,337,443 describes a diode laser having 5-10 mW optical power per micrometer facet width which contains a material of the composition $(Si_{1-s-t}Ge_{s5}C_t)_{1-x}H_x$ as passivation layer, said material being applied by means of sputtering installations. The layer thicknesses should be chosen according to $m(\lambda/4)$ (m=1, 3, 5, . . . ), where $\lambda$ represents the wavelength in the applied material. This passivation layer in turn has to be protected from the surroundings by a transparent insulation layer composed of $SiO_2$, $Al_2O_2$, MgO, ZnO, $TiO_2$ or $Si_3N_4$ having the thickness $\lambda/2$.

Japanese published patent application JP 04-032285 A likewise mentions a passivation layer composed of SiC having the layer thickness $\lambda/2$, said layer being applied by means of sputtering installations.

U.S. Pat. No. 5,780,120 is concerned with a facet treatment in ultra high vacuum by means of a PLD method (pulsed laser deposition). In this case, the laser bars were broken with exclusion of oxygen, for example in a nitrogen atmosphere. In this case, the facets are cleaned by pulsed laser radiation having the energy 70-120 mJ/cm². The cleaning is followed by further post-cleaning under Br or Cl. Afterward, a passivation layer composed of Si or GaN having a thickness up to 2 nm is applied by means of laser removal. Finally, from solid SiC, an SiC layer is deposited once again by means of PLD having energies of 1-5 J/cm².

United States patent application publication No. US 2003/0048823 A1 discloses a layer system consisting of a passivation layer and a reflection-determining layer, which layer system is applied on the facets of a diode laser by means of sputtering installations. While the passivation layer consists of Si or optionally SiC having the thickness of 1 nm, the reflection-determining layer has to consist of a nitride-containing layer, for example $Si_3N_4$.

All of the methods mentioned lead to an improvement in the long-term stability and the maximum possible output power of diode lasers in comparison with diode lasers produced without the application of a layer system (with or without prior cleaning).

The methods described are, however, very complex, since the facets of the individual high-power diode lasers or diode laser arrays either have to be broken with the exclusion of oxygen or have to be cleaned after breaking in air and subsequently have to be provided with a passivation layer to which highly reflective functional layers and/or functional layers of low reflectivity composed of different materials than the passivation layer are subsequently applied.

In the known methods, oxygen-containing chemically stable compounds such as $SiO_2$, $Al_2O_3$ or $TiO_2$ are always used for the highly reflective functional layers. Low refractive index functional layers usually contain nitrogen-containing compounds such as $Si_3N_4$. In practice, therefore, the cleaning of the broken semiconductor faces, the production of the passivation layers and at least of the highly reflective functional layers have to be effected in respectively separate vacuum chambers with a correspondingly high outlay in terms of production engineering in order to avoid uncontrolled contamination of the semiconductor interfaces and of the passivation layers with oxygen. The ultra high vacuum required in most methods during the processes leads to further requirements imposed on the installations used.

The sputtering technology that is often used in the prior art methods for depositing layers from solid sources cannot be employed in the case of the high-power diode lasers described in this invention on account of the excessively high damage to the semiconductor interfaces and the resultant great decrease in the COD threshold over time.

SUMMARY OF THE INVENTION

It is accordingly an object of the invention to provide a high-power diode laser and a production method which overcome the above-mentioned disadvantages of the heretofore-known devices and methods of this general type and which provide for a high-power diode laser having a high COD threshold in conjunction with a long service life and for a method that is suitable for producing such a laser.

With the foregoing and other objects in view there is provided, in accordance with the invention, a high-power diode laser, comprising:

facets disposed opposite one another;

each of said facets being constructed of an amorphous layer system composed of silicon and carbon;

said layer system being configured to perform a function of a passivation layer and a function of reflection-determining functional layers.

In other words, the objects related to the high-power diode laser are achieved, in accordance with the invention, in that all the layers of the facet-forming layer systems are respectively composed of silicon and carbon and thus based on only one material system that is free of oxygen. In this case, the amorphous layer systems meet the requirements both with regard to a passivation layer after the cleaning of the semiconductor cleavage faces and with regard to the reflection-determining functional layers, that is to say that these layer systems serve as reflective and antireflective systems of the laser facets. Such a high-power diode laser has a high COD threshold in conjunction with a long service life. The reason for this is the reflectivity that can be set in a simple manner by means of the quantative ratio of silicon and carbon and also the variation of said reflectivity within a layer system. Moreover, the high thermal conductivity of a layer system composed of silicon and carbon, said thermal conductivity being higher than the thermal conductivity of all the passivation and functional layers used in the prior art, affords advantages with regard to the spreading of the heat and thus the cooling of the facets. The thermal conductivity of SiC is, for example, a factor of ten higher than the thermal conductivity of $Si_3N_4$.

In this case, the term "composed" should be understood to the effect that further, process-technologically unavoidable constituents, for example hydrogen, can be contained in small concentrations.

All of the layers of the facet-forming layer systems are based on only one oxygen-free material system, which makes it possible to produce them in the absence of oxygen in only one process chamber. Thus, cost-effective PECVD (plasma enhanced chemical vapor deposition) installations from Si technology can be used for carrying out all the production processes, only one installation with only one process chamber being required for cleaning and coating, and at most a high vacuum, but not an ultra high vacuum, being required for carrying out the method in the process chamber. The outlay in terms of production engineering and apparatus is significantly reduced as a result. Moreover, the sputtering installations that cannot be used for high-power diode lasers on account of the excessively great damage to the semiconductor can be replaced by a distinctly less damaging deposition method.

By contrast, in all of the methods currently used for coating high-power diode lasers, it is necessary to employ either installations having at least two integrated process chambers and a handling device that makes it possible to transfer the substrate to be processed from one process chamber into the other, or at least two separate installations each having a process chamber. Accordingly, the installation costs are reduced by approximately 50% in the case of the method according to the invention in comparison with the methods used in the prior art.

With the above and other objects in view there is also provided, in accordance with the invention, a method of producing a high-power diode laser, the method which comprises:

providing a laser structure with cleavage faces lying opposite one another;

depositing an amorphous layer system composed of silicon and carbon on each of the cleavage faces by way of a CVD process (preferably a PECVD, plasma enhanced chemical vapor deposition process); and thereby forming the amorphous layer system to perform a function both of a passivation layer and of reflection-determining functional layers of the laser.

In accordance with an added feature of the invention, the cleavage faces are cleaned prior to applying the layer system at most under high vacuum by means of plasma methods using a forming gas. In a preferred embodiment, the process uses argon and/or hydrogen as the process gas, with particles having kinetic energies less than 20 eV.

In accordance with a concomitant feature of the invention, methane and silane are used as process gases for the deposition. Finally, the layer system consisting of silicon and carbon is applied in one and the same (i.e., common) process chamber.

Other features which are considered as characteristic for the invention are set forth in the appended claims.

Although the invention is illustrated and described herein as embodied in a high-power diode laser and method for producing a high-power diode laser, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
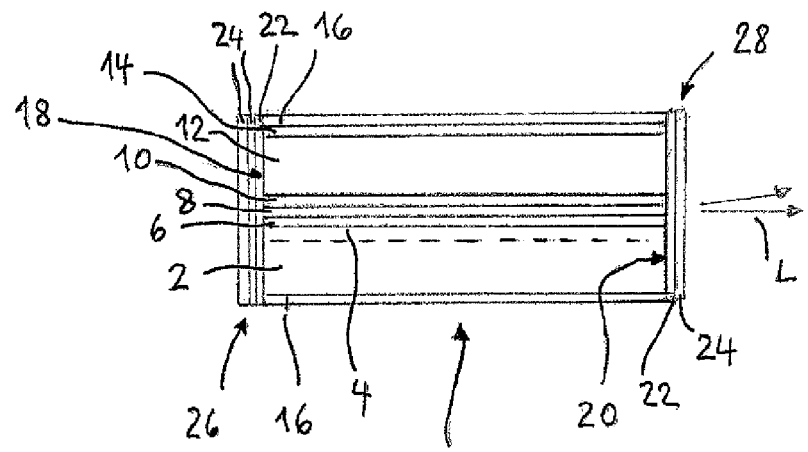
FIG. 1 is a simplified basic illustration of a section through a high-power diode laser with a layer system on both sides, which is in each case composed of a passivation layer and reflection-determining functional layers, according to the present invention.

Referring now to the figures of the drawing in detail and first, particularly, to FIG. 1 thereof, there is shown an exemplary embodiment of a high-power diode laser produced on the basis of GaAs substrates. Diode lasers based on other III-V semiconductor materials, for example based on InP or GaSb substrates can likewise be produced.

In the case of the high-power diode laser produced on the basis of a GaAs substrate, an n-doped cladding layer 4 (e.g. AlGaAs, InGaAsP, AlGaAsSb), an n-side waveguide layer 6 (e.g. AlGaAs, InGaAsP, AlGaAsSb), a quantum well structure 8 (e.g. InGaAs, InGaAsP, GaInSb, GaInAsSb), in which the recombination processes that generate the laser light take place, a p-side waveguide structure 10, a p-doped cladding layer 12 and p-doped contact layer 14 (e.g. GaAs, GaSb, InP, InGaAs) are deposited successively on an n-GaAs substrate 2.

By etching the contact layer 14, contact strips for current injection are defined, the width of which is between 90 μm and 100 μm, for example. The extent of the optical wave in a lateral direction, that is to say perpendicular to the plane of the drawing, is thereby defined by the width of the contact strips. An insulation layer 16 and also p-side and n-side metallization sequences (not illustrated in the figure) for electrical contact-connection complete the overall layer construction.

The wafers that have been provided with the above-mentioned semiconductor layers and structured are divided into individual diode laser bars by scribing and cleavage in air, said diode laser bars in turn consisting of a plurality of high-power diode lasers.

End sides that lie opposite one another and are oriented perpendicular to the layer construction form the so-called cleavage faces 18, 20. Since a layer of semiconductor oxides and contaminants such as water and gas adsorbates immediately arise on cleavage faces 18, 20 produced in air, and limit the maximum possible output power and the lifetime of the high-power diode lasers, the present invention provides for cleaning the cleavage faces 18, 20 and subsequently encapsulating them by means of a layer system consisting of silicon and carbon.

For this purpose, the diode laser bars are arranged in a holder in such a way that both cleavage faces 18, 20 are accessible. The holder is introduced into an evacuatable process chamber of a PECVD or thermal CVD system. By means of a chemical plasma method that takes place in the absence of oxygen, the oxide-affected cleavage faces 18, 20 are subsequently cleaned and reduced, the energy of the ions in the plasma being less than 20 eV. Forming gases such as, for example, argon gas and/or hydrogen gas are used as process gases for the cleaning.

In this case the efficiency of the cleaning is given by an optimum choice of the process parameters for temperature and pressure. The cleaning temperature should be as high as possible. In the exemplary embodiment, a typical cleaning temperature is approximately 400° C. and is limited toward higher temperatures by the alloying temperatures or the damage of the p- and n-metallization sequences. The base pressure in the process chamber does not have to be in the UHV range, but rather can be in the range of $1 \times 10^{-1}$ to $1 \times 10^{-2}$ mbar.

Afterward, the cleaned cleavage faces 18, 20 are protected against renewed oxidation or contamination in situ, that is to say in the same process chamber. This is done by applying a passivation layer 22, which is inert with respect to the adjacent semiconductor materials and preferably binds any oxide layers possibly still present in a chemically stable manner. Moreover, the passivation layer 22 serves to prevent renewed contact of the semiconductor layers with oxygen and other contaminants which can penetrate from outside by means of diffusion.

The passivation layer 22 acts a diffusion barrier, on the one hand, but on the other hand is still transmissive to the laser light generated within the quantum well structure 8. The passivation layer 22 is electrically insulating or at least of high impedance, with the result that only negligible portions of the current flow via the cleavage faces 18, 20 during operation.

The passivation layer 22 consists of an amorphous layer consisting of silicon and carbon. Said layer is deposited by means of chemical vapor deposition (CVD), preferably thermal CVD, in particular by means of plasma enhanced chemical vapor deposition (PECVD). Damage to the cleaved semiconductor interface layers during the application of the layer systems is substantially avoided by means of such coating methods.

Methane ($CH_4$) and silane ($SiH_4$) are preferably used as process gases for the deposition. The composition of the passivation layer 22 and hence the properties thereof can be set by way of the gas flows of the process gases and also by means of further process parameters such as pressure, temperature and deposition duration.

In the exemplary embodiment, at identical base pressures with respect to the cleaning phase a 5 nm to 50 nm thick amorphous layer consisting of silicon and carbon is deposited, the silicon proportion of which is greater than the carbon proportion. The deposition duration is preferably of the same order of magnitude as the cleaning duration and is the range of between 10 seconds and a plurality of minutes. For the deposition, the process chamber is preferably kept at a temperature of between 200° C. and 300° C.

Afterward, functional layers 24 are applied to the two passivation layers 22 by means of which functional layers the reflectivity of the respective cleavage face 18, 20 is set. These functional layers 24, which are of low reflectivity and/or are highly reflective depending on the desired reflectivity, likewise consist of silicon and carbon and, since they are based on the same material system as the passivation layers 22, can be applied in the same process chamber.

For antireflective coating, a single amorphous, low refractive index functional layer 24 consisting of silicon and carbon is deposited onto one of the cleavage faces 19, 20 respectively provided with the passivation layer 22, onto the cleavage face 20 in the exemplary embodiment illustrated. 1.99 was set as refractive index in the exemplary embodiment of this invention. By comparison with an Si/N functional layer that is constructed from silicon and nitrogen and is often used in the prior art this functional layer additionally has the advantage of being chemically and thermally stabler. The layer thickness of said functional layer 24 is one quarter of the target wavelength λ of the emitted laser light L divided by the refractive index (1.99 in the application example).

The highly reflective layer system applied to the opposite cleavage face 18 provided with the passivation layer 22, with a reflectivity of >90%, consists of an amorphous layer system constructed from a plurality of functional layers 24 respectively consisting of silicon and carbon, the high reflectance being set by means of a greatest possible difference in the refractive index of adjacent functional layers 24. By way of the layer thicknesses of the individual functional layers 24, the reflective wavelength range is set between 600 nm and 3000 nm.

The refractive indices of the individual passivation and functional layers are set by varying the carbon content during the deposition of the layer system.

In the case of a carbon content of 5 atom % the refractive index is 3.6. In the case of a carbon content of 95 At. %, the refractive index is approximately 1.7. In principle, the refractive indices of the functional layers 24 can be between 1.4 and 3.8.

For a highly reflective layer system, alternating functional layers 24 having the refractive index limit values 1.4 and 3.8 are thus preferred. Each of these functional layers preferably has a thickness of one quarter of the wavelength to be reflected. The layer thicknesses are thus between 125 nm and 750 nm.

The layer systems 26 and 28 that consist of passivation layer 22 and functional layers 24 and are respectively applied to the cleavage faces 18, 28 form the facets of the completed high-power diode laser.

Exemplary Embodiment 1

Preliminary Product

Broad-stripe high-power diode lasers were produced as a preliminary product for the production of a high-power diode laser according to the invention, the cleavage faces of which lasers were cleaned as explained above and provided only with a passivation layer 22 consisting of silicon and carbon.

Comparative Example 1

Comparative Product

High-power diode lasers identical to the preliminary product in accordance with exemplary embodiment 1 were produced as comparative example 1, the cleavage faces of which lasers were cleaned as explained above and provided with a passivation layer 22 consisting of silicon and carbon, but the optical functional layers of which lasers, differently from the method according to the present invention, consist of silicon and nitrogen at the coupling-out facet and of a double pair of silicon and silicon oxide at the mirror facet and they were applied in each case in a separate sputtering installation.

Exemplary Embodiment 2

End Product

A preliminary product in accordance with exemplary embodiment 1 was processed to completion by functional layers 24 being applied to the passivation layers 22, said functional layers being constructed from silicon and carbon according to the invention.

Comparative Example 2

In a comparative example, high-power diode lasers having a facet coating were produced by means of a sputtering installation in accordance with the prior art. The cleavage faces were cleaned by means of an Ar flash having a power of 600 W. The optical functional layers consist of silicon and nitrogen at the coupling-out facet and of a double pair of silicon and silicon oxide at the mirror facet, and no passivation layer was applied to the cleaned cleavage faces.

Both in exemplary embodiments 1 and 2 and in comparative examples 1 and 2, the high-power diode lasers had a resonator length of 4000 µm and a strip width of 90 µm.

High-power diode lasers from all four production methods were subjected to a loading test. In this case, the current was driven up to 40 A at a temperature of 20° C. with a pulse length of 50 µs and repetition rate of 50 Hz.

Figure 2:
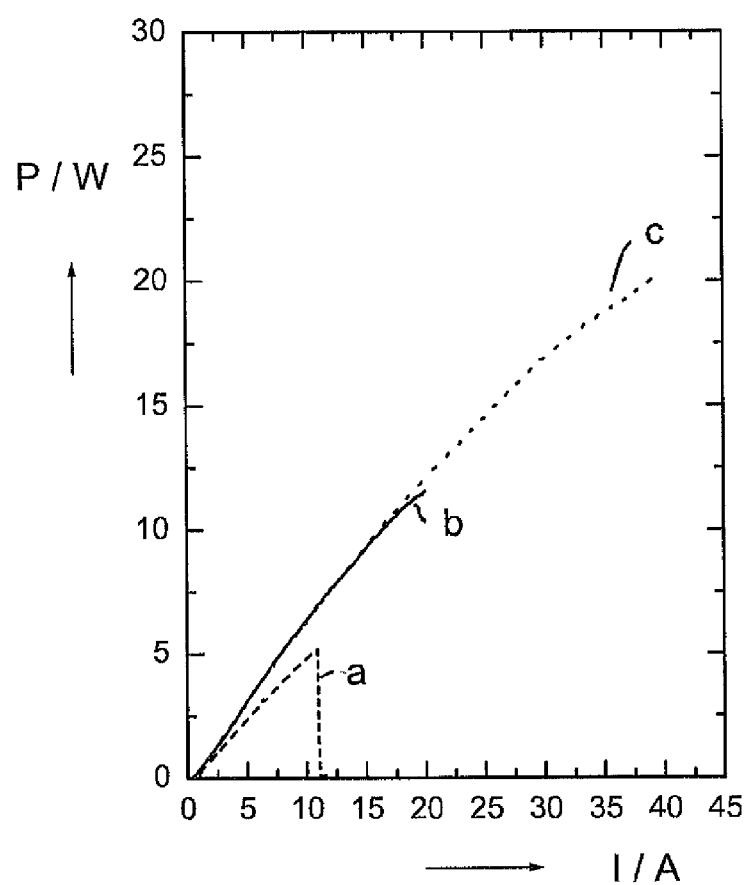
FIG. 2 is a diagram in which the output power is plotted against the operating current under various operating conditions for differently produced high-power diode lasers.

In the diagram in accordance with FIG. 2, in curve a the optical output P is plotted against the operating current I for a high-power diode laser operated in pulsed fashion, said diode laser not being provided with a layer system (as cleaved). Curves b and c are produced with a high-power diode laser that was produced in accordance with exemplary embodiment 1 and not processed to completion, under continuous operating conditions (curve b) and pulsed operating conditions (curve c). It can be gathered from the diagram that the preliminary product in accordance with exemplary embodiment 1 in pulsed operation exhibits a maximum power four times higher than that of a high-power diode laser not provided with a layer system. Moreover, the high-power diode laser produced in accordance with exemplary embodiment 1 (preliminary product) does not exhibit COD failure of the facet even at 40 A, in contrast to the as-cleaved diode laser. In continuous operation, too, no COD failure could be observed until 20 A.

Figure 3:
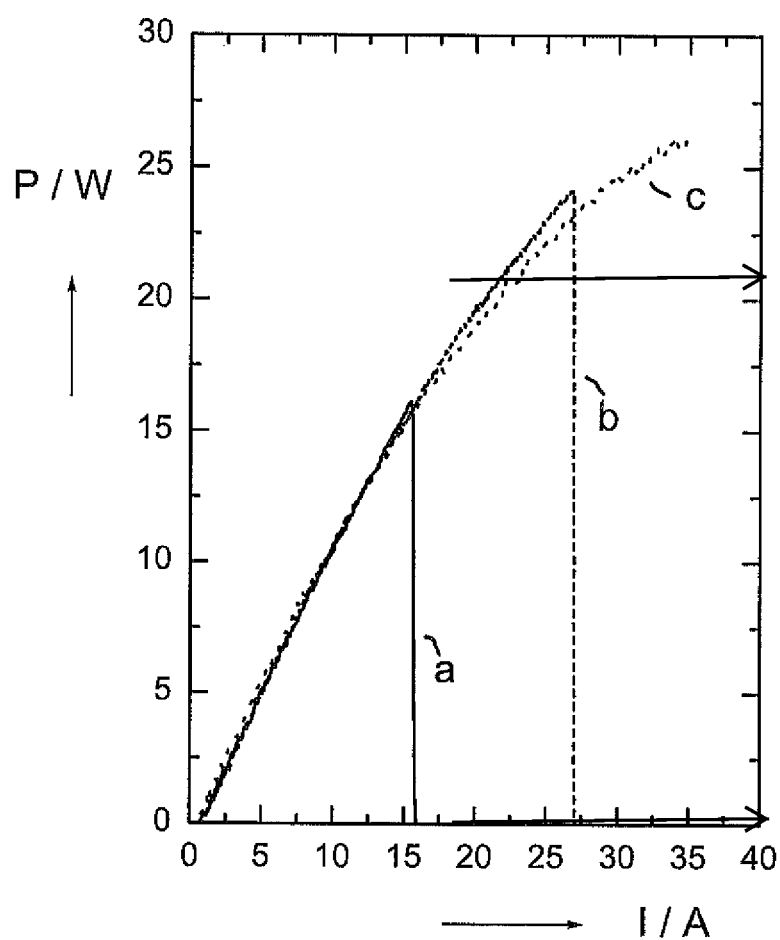
FIG. 3 is a diagram in which the output power is likewise plotted against the operating current under pulsed operating conditions for differently produced high-power diode lasers.

In the diagram of FIG. 3, curves a, b and c, plot the output power P against the operating current I for comparative examples 2 (curve a) and 1 (curve b), and exemplary embodiment 2 (curve c) processed to completion under pulsed conditions in each case. While a maximum power of 16 W at an operating current of 15.4 A was measured in the case of the high-power diode laser produced in accordance with comparative example 2, a maximum power of 24 W was able to be measured in the high-power diode laser produced in accordance with comparative example 1 and a maximum power of 26 to 27 W at an operating current 35 to 37 A was able to be measured in the case of the high-power diode lasers produced in accordance with the exemplary embodiment.

It follows from this that applying layer systems consisting of silicon and carbon to the previously cleaned cleavage faces independently of the optical functional layers subsequently applied enables distinctly higher optical power densities on the facets than in the case of facets produced by conventional methods. Moreover, this layer system consisting of silicon and carbon is stable with respect to layers subsequently applied by means of sputtering installations.

The tightness and the chemical long-term stability of the layer systems on the laser facets are responsible for the long-term stability of the laser diodes.

In a further functional test, broad-stripe, high-power diode lasers produced in accordance with exemplary embodiment 2 and in accordance with comparative example 2 were subjected to an aging test. During the test, which was carried out for 2500 hours at a temperature of 30° C. the diodes were stabilized at a fixed operating current. After a certain operating period, the operating current was increased by a fixed amount and stabilized again.

Figure 5:
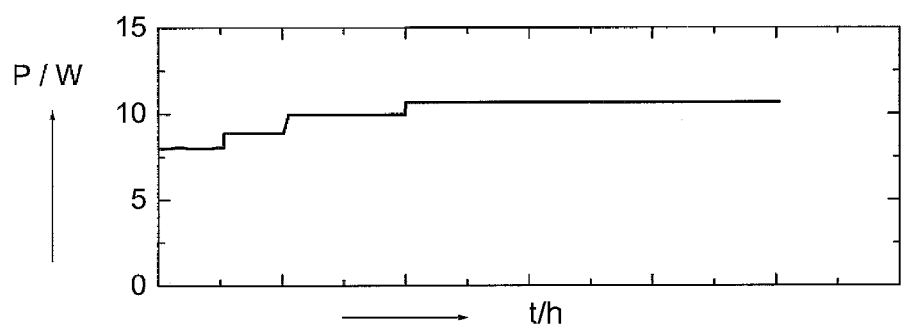
FIG. 5 is a similar diagram relating to a high-power diode laser produced according to the present invention.
Figure 4:
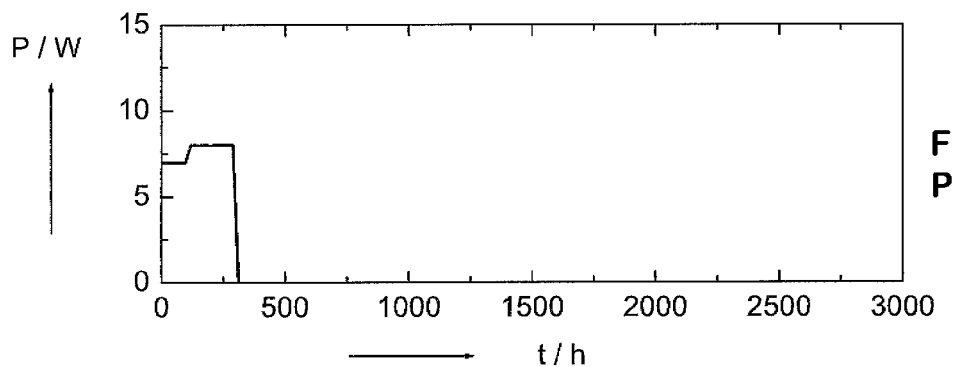
FIG. 4 is a diagram in which the optical output power, with a constant operating current, is plotted against the operating time period for a high-power diode laser whose facets were produced in accordance with the prior art.

In the diagrams in FIGS. 4 and 5, the respective optical output power P is plotted against the operating period t. FIG. 4 shows the temporal profile of the output power P for a high-power laser produced in accordance with comparative example 2. FIG. 5 shows the temporal profile of the output power P for a high-power diode laser produced in accordance with exemplary embodiment 2. While the high-power diode laser produced in accordance with exemplary embodiment 2 failed after just a few 100 hours, the high-power diode laser produced in accordance with exemplary embodiment 2 exhibited no visible degradation, even though the optical output power was increased in steps. This shows the good long-term stability of layer systems consisting of silicon and carbon.

The invention claimed is:

1. A high-power diode laser, comprising:
   facets disposed opposite one another;
   each of said facets being constructed of an amorphous layer system including at least one passivation layer and a plurality of functional layers essentially composed of silicon and carbon;
   said layer system being configured to perform a function of the passivation layer and a function of reflection-determining functional layers;
   a reflection of said layer system being determined by said functional layers having varying refractive indices; and
   said functional layers having a carbon content of between 5 at % and 95 at %, the carbon content determining the refractive indices of said functional layers, with at least one of said functional layers having a relatively higher refractive index due to a relatively lower carbon content and at least one of said functional layers having a relatively lower refractive index due to a relatively higher carbon content.

2. A high-power diode laser, comprising:
   facets disposed opposite one another;
   each of said facets being constructed of an amorphous layer system including at least one passivation layer and a plurality of functional layers consisting essentially of silicon and carbon;
   said layer system being configured to perform a function of a passivation layer and a function of reflection-determining functional layers;
   a reflectivity of said layer system being determined by said functional layers and said passivation layer having varying refractive indices;
   the refractive indices of said functional layers and said passivation layer being determined by a carbon content thereof;
   wherein at least one of said functional layers has a relatively higher refractive index due to a relatively lower carbon content and at least one of said functional layers has a relatively lower refractive index due to a relatively higher carbon content.

3. The high-power laser diode according to claim 1, wherein a layer thickness of each of said functional layers is between 125 nm and 750 nm.

4. The high-power laser diode according to claim 1, wherein a difference in the refractive index of mutually adjacent functional layers is set to be at a maximum.

5. The high-power laser diode according to claim 1, wherein the refractive index of each of the functional layers lies between 1.4 and 3.8, with the relatively higher refractive index being approximately 3.8 and the relatively lower refractive index being approximately 1.4.

6. The high-power laser diode according to claim 2, wherein the carbon content of each of the functional layers lies between 5 atom % and 95 atom %.

7. The high-power laser diode according to claim 4, wherein the layer system includes an alternating arrangement of functional layers having a refractive index of 1.4 and 3.8, with the relatively higher refractive index being approximately 3.8 and the relatively lower refractive index being approximately 1.4.

* * * * *